United States Patent [19]

Terrell

[11] Patent Number: 5,153,852
[45] Date of Patent: Oct. 6, 1992

[54] STATIC RAM CELL WITH HIGH SPEED AND IMPROVED CELL STABILITY

[75] Inventor: William C. Terrell, Thousand Oaks, Calif.

[73] Assignee: Vitesse Semiconductor Corporation, Camarillo, Calif.

[21] Appl. No.: 622,227

[22] Filed: Dec. 3, 1990

Related U.S. Application Data

[60] Division of Ser. No. 512,061, April 18, 1990, Pat. No. 4,995,000, which is a continuation of Ser. No. 214,175, Jul. 1, 1988, abandoned.

[51] Int. Cl.$^5$ .............................................. G11C 13/00
[52] U.S. Cl. ...................................... 365/154; 365/51
[58] Field of Search ...................... 365/154, 51, 182; 357/23.1

[56] References Cited

U.S. PATENT DOCUMENTS 5,086,410  2/1992  Bergemont ............................ 365/51

Primary Examiner—Terrell W. Fears
Attorney, Agent, or Firm—Benman and Collins

[57] ABSTRACT

The speed and stability of a 4T static RAM cell (10) comprising cross-coupled inverters with two driver transistors (18, 20) and two pass-gate transistors (14,16) are improved by replacing the driver transistors with a modified driver element (33, 35), comprising at least two transistors (18, 18') having common gates and common sources and with a resistor (42) connecting the drains.

3 Claims, 4 Drawing Sheets

STATIC RAM CELL WITH HIGH SPEED AND IMPROVED CELL STABILITY

This is a division of application Ser. No. 07/512,061, filed Apr. 18, 1990, now U.S. Pat. No. 4,995,000, which in turn is a continuation of application Ser. No. 07/214,175, filed Jul. 1, 1998, now abandoned.

TECHNICAL FIELD

The present invention relates to static random access memory (RAM) cells, and, more particularly, to a static RAM cell having both increased speed and improved stability.

BACKGROUND ART

A conventional four-transistor (4T) RAM cell consists of a two transistor, two resistive-load cross-coupled inverters plus two access transistors (also known as wordline, transfer gate, or pass-gate transistors), such as described in S. M. Sze, VLSI Technology, McGraw-Hill, New York, pp. 473-478 (1983). The two transistors in the cross-coupled inverter, are known as driver or pull-down transistors. These transistors act as switches wherein current flow from the drain to source regions is controlled by the voltage on the gate region. Referring to FIG. 1, two nodes exist in the cell: node 1 connects one load, the drain of one pass-gate transistor, T2, the drain of one driver transistor, T1, and the gate of the other driver transistor T3. Node 2 connects the other load, the drain of the other pass-gate transistor, T4, the drain of T3, and the gate of T1. These two nodes are the storage nodes of the memory cell and must achieve stable logic values during standby and during cell reading for reliable operation.

In such cells, data retention reliability is a direct function of cell stability and noise margin. This noise margin is measured by how well one driver transistor, T1, holds a low logic level. This low level must remain below the threshold voltage of the other driver transistor, T3, to insure that T3 is off, and therefore to prevent the from flipping. This condition is known as bistability and implies that the two storage nodes of the cell achieve valid logic values, one being a logic high and the other a logic low. These levels are maintained due to the feedback in the cross-coupled inverter. If node 1 exceeds the threshold of T3, then T3 will conduct and easily degrade the high level on node 2. This condition results in unstable operation if the leakage current in T3 exceeds the current supplying capability of the load means 28. Unstable operation means that the cell will change state.

The worst case for cell logic low level is during the time the word line is being selected and the transfer gate, T2, begins to pull up against T1. A good logic low on node 1, and therefore good noise margin and stability, is achieved by making T2 small with respect to T1. However, the speed with which the cell develops differential to the sense amp during read is determined by the rate at which the bit line capacitance is discharged through the T2, T1 pair and therefore by the size of the transfer gate, T2 (W/L). For high cell pull current, T2 should be sized large with respect to T1, High cell pull current results in fast cell read access time, since that current is responsible for slewing the bit-line capacitance and developing differential to the sense amp. The sense amp is a differential amplifier whose inputs are BIT and $\overline{\text{BIT}}$.

These conflicting transfer gate sizing requirements for speed and stability limit the ultimate performance of the traditional cell configuration. The cell must be designed to meet a minimum stability level for reliable operation over process variations and operating conditions. Once stability is designed for, cell pull current is fixed and cannot be increased.

This problem is exacerbated in enhancement/depletion mode GaAs RAM design, since the enhancement FET threshold voltage has a strong dependence on temperature and drops significantly at elevated operating temperatures This forces the transfer gate to further decrease in size to maintain cell stability over wide temperature ranges. This decreased size slows down the cell read access time.

Thus, the conventional approach is drastically limited in flexibility to address this tradeoff of speed versus stability. Many static RAM manufacturers have simply decreased the pull-down driver to transfer gate ratio to get improved cell speed, but as a result are plagued with marginally stable cells and "weak bits" which are hard to detect and test. Typical ratios of pull-down size to transfer gate are between three and five (in terms of W/L).

The only other alternative to speeding up the cell is to maintain an adequate cell ratio for stability and then scale FET sizes up to get increased cell pull current. However, this increases chip size and power and is only marginally effective, since the load capacitance the cell must drive scales with cell size as well. There may be no real improvement in cell speed by this method.

Thus, it is desired to achieve both high speed and stability in a GaAs static RAM cell, without having to compromise one or the other property.

DISCLOSURE OF INVENTION

In accordance with the invention, an FET-based static RAM cell is provided with both high speed and stability by replacing each driver transistor with a two-transistor element wherein the two transistors in the element are in parallel, with the sources in common, the drains separated by a resistor, and the gates in common. Such an element decouples stability requirements from cell pull current requirements.

High cell pull current is achieved by sizing the transfer gate, T2, large with respect to the pull-down driver, T1. Adequate logic zero level at node 1 for stability is achieved by sizing the pull-down driver, T1A large enough to drop the excess voltage from node 3 across the added resistor. By picking a large value of resistance for the added resistor, T1A can be reasonably small for small cell size and still achieve excellent noise margin and stability.

There are many structures which provide the two-transistor element with resistor connecting the drains. Broadly, the resistor is obtained by forming two smaller ohmic drain contacts separated a doped drain region. Alternatively, undoped polysilicon could be deposited between the two smaller drain contacts to provide the required resistance. Or, one or more discrete resistors may be employed, at the sacrifice of cell size.

BEST MODES FOR CARRYING OUT THE INVENTION

Figure 1:
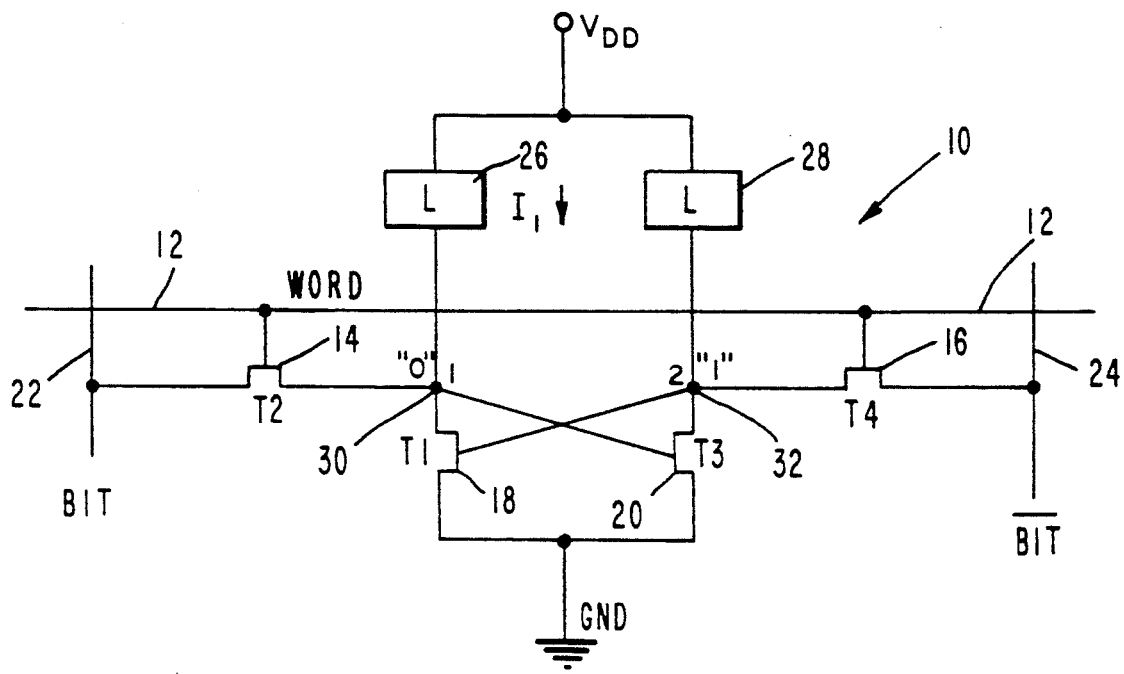
FIG. 1 is a schematic circuit diagram of a prior art static RAM cell.

Referring now to the drawings wherein like numerals of reference designate like elements throughout, a circuit diagram of a conventional six-element FET static RAM (SRAM) cell 10 is depicted in FIG. 1. The cell 10 comprises a word line 12 to which are connected the gates of two access transistors 14, 16, which provide access into the cell for reading or writing thereof.

A cross-coupled inverter comprising pull-down, or driver, transistors 18, 20 is connected through the access, or transfer gate, transistors 14, 16 to BIT line 22 and $\overline{\text{BIT}}$ line 24, respectively. Load devices 26, 28 may comprise high value resistors (e.g., $10^9$ Ω), for example, polysilicon, or depletion mode or enhancement mode transistors, or p-transistors or other common load device.

Transistors 14 and 18 share a common node 30 ("node 1"), to which the resistive load 26 and the gate of transistor 20 are connected. Transistors 16 and 20 share a common node 32 ("node 2"), to which the resistive load 28 and the gate of transistor 18 are connected.

Each transistor in the cell 10 comprises a source and drain region connected by a channel region, to which electrical contact is made A gate overlies the channel region and is insulated therefrom. The operation of SRAM cells is well-known and will not be described further here.

Figure 2:
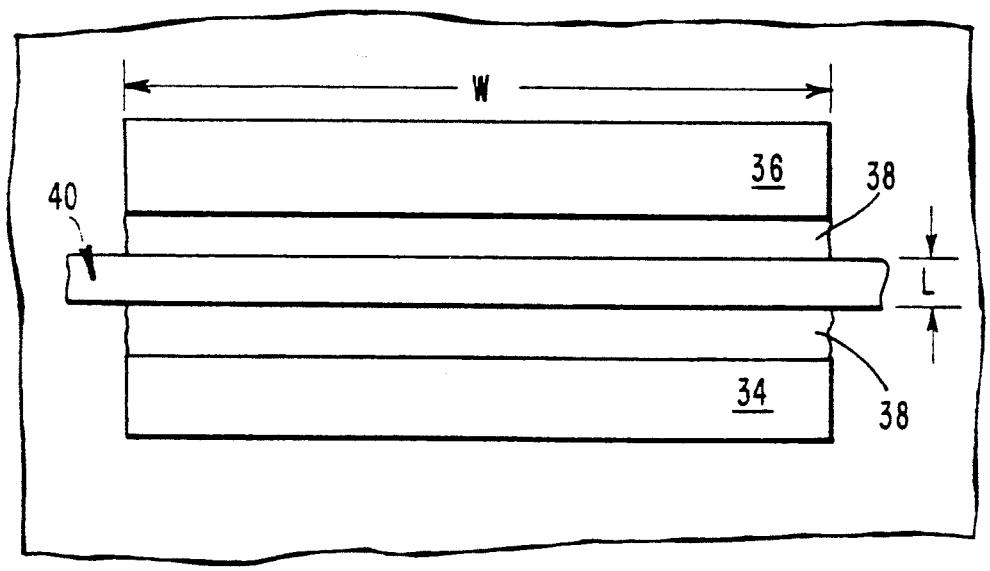
FIG. 2 is a top plan view of the source, gate, and drain ohmic contacts for a conventional FET of the prior art.

The top plan view of an FET transistor, such as driver transistor 18, 20 (TI, T3) is shown in FIG. 2. There, source and drain ohmic contacts 34, 36, respectively, are separated by an FET channel 38, contacted by a gate contact 40. As is well-known for GaAs FETs, no gate oxide is present.

As indicated earlier, data retention reliability for the design illustrated in FIG. 1 is a direct function of cell stability and noise margin. This noise margin is measured by how well the driver transistor 18 (T1) holds a logic low level. This low level must remain below the threshold voltage of transistor 20 (T3) to prevent the cell 10 from flipping. If node 30 (1) exceeds the threshold of transistor 20 (T3), then transistor 20 will conduct and easily degrade the high level on node 32 (2).

In accordance with the invention, two-transistor, drain-coupled resistor elements 33, 35 are added to the circuit 10 to decouple stability requirements from cell pull current requirements. The circuit elements 33, 35 replace the existing driver transistors 18, 20, respectively.

Figure 3:
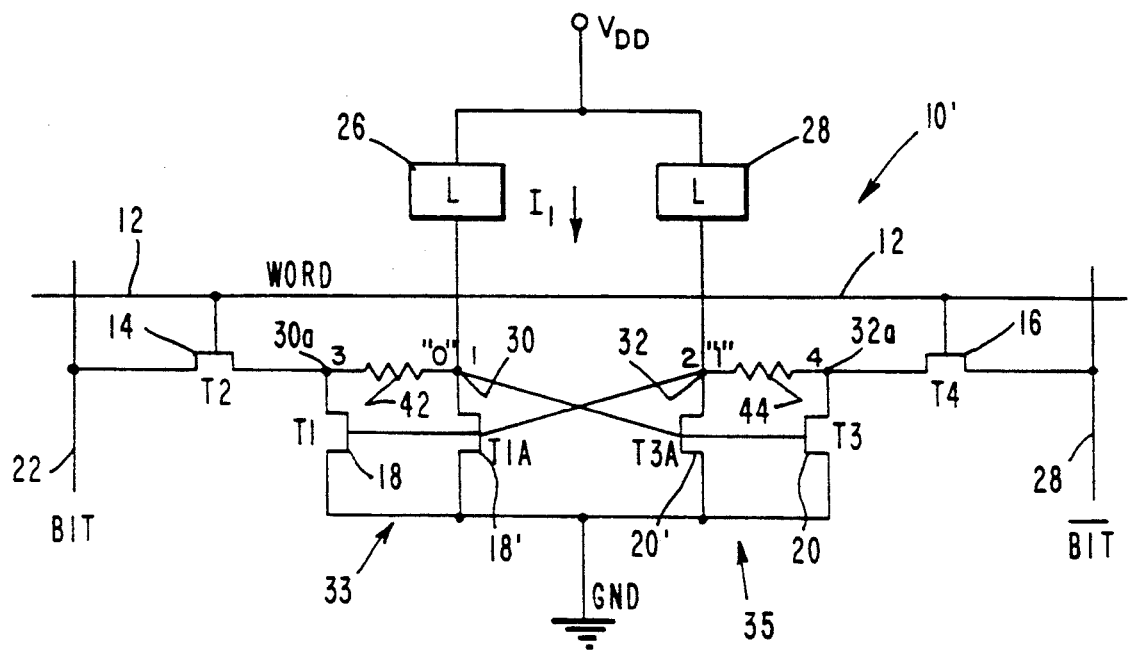
FIG. 3 is a schematic circuit diagram of the static RAM cell in accordance with the invention.

The modified circuit 10' is shown in FIG. 3. Referring to circuit element 33, high cell pull current is achieved by sizing the transfer gate 14 (T1) large with respect to the pull-down driver 18 (T2). FIG. 2 depicts the size considerations of an FET as to width W of the contacts 34, 36 and the length L of the gate 40.

Use of the circuit element 33 of the invention permits a ratio of pull-down size to transfer gate of 1 to be employed (as opposed to 3 to 5 for the conventional cell). Adequate logic zero level at node 30 (node 1) for stability is achieved by sizing pull-down driver 18' (T1A) large enough to drop the excess voltage from node 30a (3) across the resistor 42. By picking a large value of resistance for the resistor 42, transistor 18' (T1A) can be reasonably small for small cell size and still achieve excellent noise margin and stability. Typically, the size of transistor 18' is substantially equivalent to that of transistor 18. The resistance of resistor 42 typically ranges from about 1 kΩ to 4 kΩ.

The only restriction on maximum resistor size is that during a write, the cell load current, $I_1$, does not produce a large enough voltage drop across resistor 42 to prevent the write driver from pulling node 30 (1) low enough to flip the cell. Since $I_1$ is typically less than 1 μA, this condition is easily met.

Lastly, the resistor 42 and transistors 18 (T2) and 18' (T2A) need not be separate devices in the layout. For small cell size, this circuit combination is formed with a structure which purposefully introduces large drain resistance in the middle of an FET as shown in FIG. 4a.

The same considerations obtain with respect to replacing driver transistor 20 (T3) with circuit element 35, comprising driver transistors 20, 20' (T3, T3A), with drains connected by resistor 44.

This new cell design decouples the traditional tradeoff of speed versus stability, allowing high speed with good stability, and does so with little impact on cell size over the conventional approach.

Figure 4A:
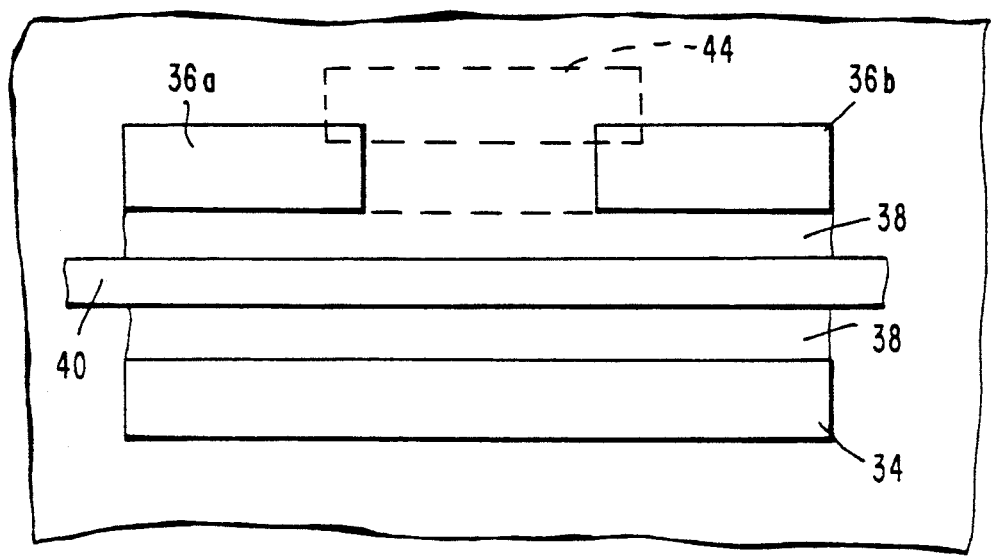
FIG. 4a is a top plan view of the source, gate, and drain ohmic contacts for the FET of the invention.

One structure that may be used to achieve the added circuit element provided by the invention is shown in FIG. 4a. There, it is seen that the central portion of the drain contact 36 is "missing". That is, the drain contact mask is modified so as to form two drain contacts 36a, 36b, separated by a portion 36c of the n+ active region, which is typically about 200 ohms/square. The equivalent circuit diagram is depicted in FIG. 4b.

As indicated above, the range of resistance of resistor 42 is about 1 to 4 kΩ for the circuit shown in FIG. 3. It will be appreciated by those skilled in this art that the resistance value will be different for other materials, other cell arrangements, and other implementations. The resistance value is not critical, and depends on cell current.

In an alternative embodiment, a resistive element 44 could be deposited, contacting the two drain contacts 36a, 36b. An example of such a resistive element, shown in dashed lines in FIG. 4a, is polysilicon, which could be deposited either before or after forming the drain contacts, using a separate deposition step. The polysilicon may be doped to the appropriate level to achieve the desired resistance. Since added steps would be required, this embodiment is not as preferred as the first-described embodiment. However, there may be instances where the use of polysilicon would outweigh the added steps.

Figure 4B:
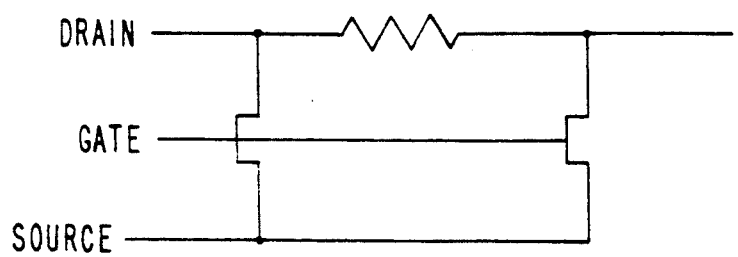
FIG. 4b is an equivalent circuit diagram of the two-transistor, resistor element formed thereby.

In yet another embodiment, the added circuit element could be formed by two separate transistors, separated by the resistive element, as shown in FIG. 4b. Such a configuration would add to the size of the cell and to the complexity of the masks used to form the driver transistors, but might be desirably used under certain circumstances.

Figure 5:
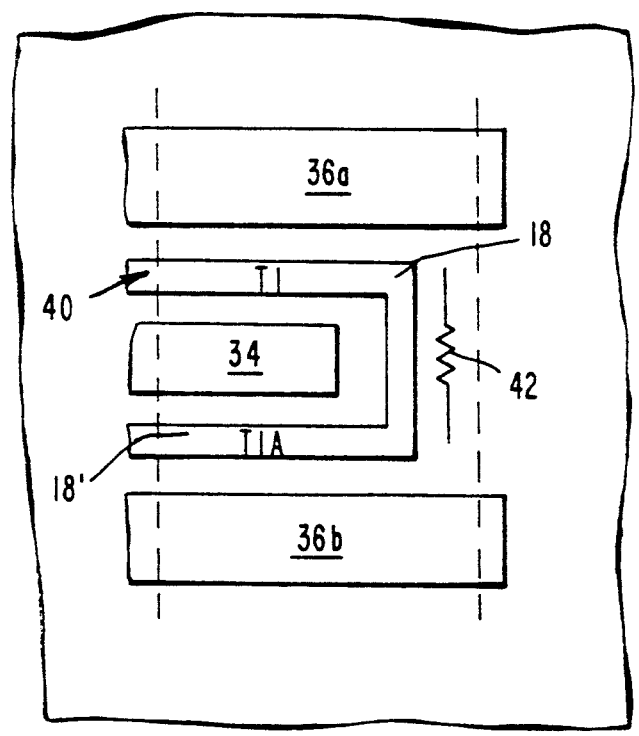
FIG. 5 is a top plan view similar to that of FIG. 4a, depicting a preferred embodiment.

A preferred layout of the first-described embodiment is depicted in FIG. 5. There, it is seen that the U-shaped gate 40 configuration, with source ohmic contact 34 in the bight thereof and with two ohmic drain contacts 36a, 36b exterior the U-shaped gate, results in considerable space savings, with consequent further increase in device speed and hence increase in cell speed.

Figure 4C:
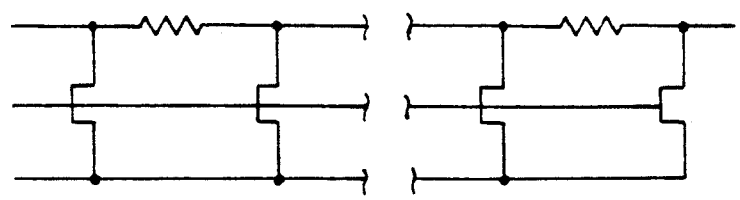
FIG. 4c is a diagram similar to that of FIG. 4b, except depicting the general case.
Figure 6:
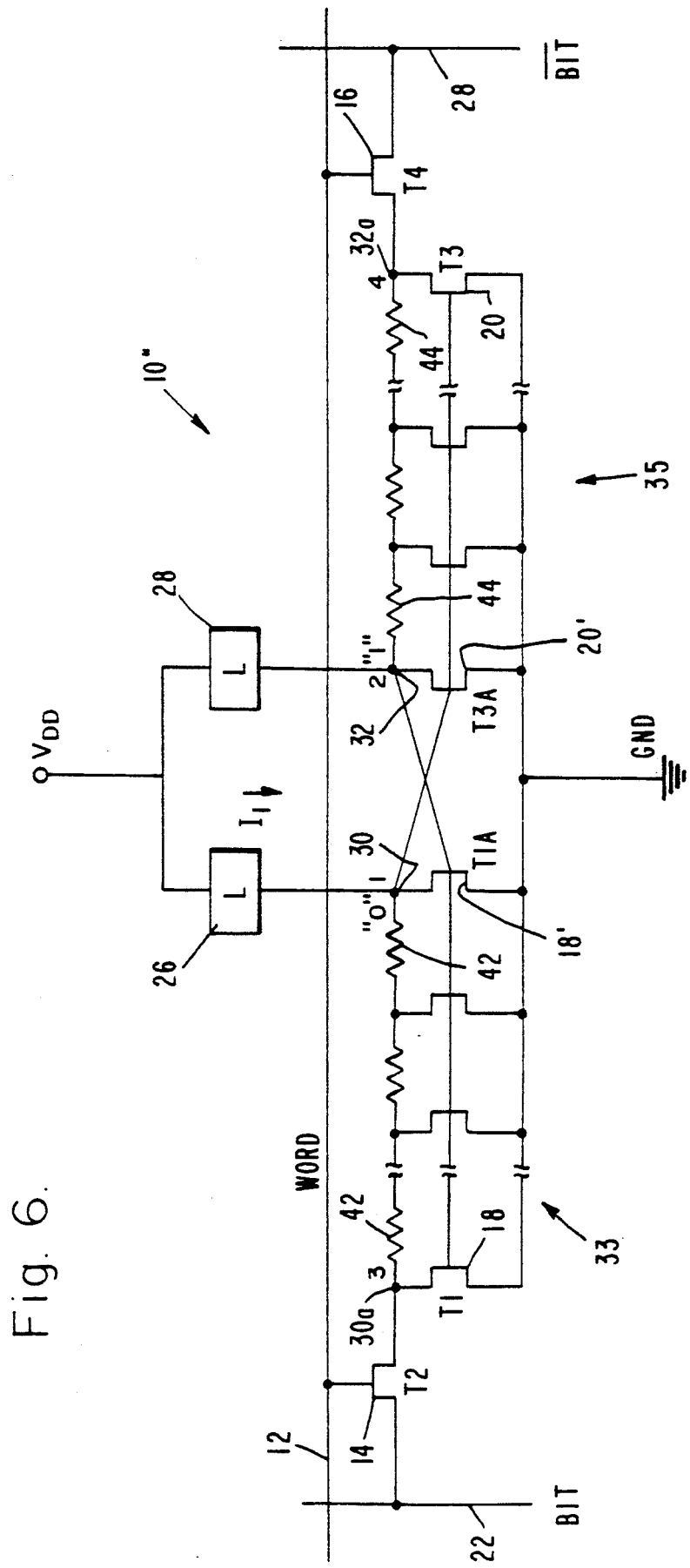
FIG. 6 is a view similar to that of FIG. 3, including the diagram shown in FIG. 4c.

In its broadest implementation, FIG. 6 depicts the equivalent circuit, which is a combination of FIGS. 3 and 4c.

The added circuit element of the invention has been described in terms of a GaAs FET-based static RAM 4T cell However, it will be clear to one of ordinary skill in the art that it could be employed in well-known variants of such cells. Further, the circuit element may be used in other III-V-based materials systems, as well as in silicon-based cells. Finally, the circuit element may be utilized in CMOS, MOSFET, MESFET, bipolar, and other circuits.

INDUSTRIAL APPLICABILITY

The added circuit element of the invention is expected to find immediate use in GaAs FET-based static RAM cells.

Thus, there has been disclosed a static RAM circuit in which the driver transistors are replaced by a pair of transistors having common gates and sources and a resistive element coupling the drains. It will be apparent to one of ordinary skill in the art that the added circuit element of the invention may be utilized in other circuits and in other materials technologies, as, for example, described above, and that other changes and modifications of an obvious nature may be made without departing from the spirit and scope of the invention, as defined by the appended claims.

What is claimed is:

1. A pair of field effect transistors formed on a semiconductor substrate, each comprising a source region having an ohmic contact thereto and a drain region having an ohmic contact thereto and a channel region therebetween contacted by a gate contact, characterized by (a) common gates and common sources, with the drains interconnected with a resistor and provided with two separate drain contacts, and (b) said gate contact forming a U-shaped configuration defining a bight region therein, with said source contact in said bight region and with said separate drain contacts formed on either side of said U-shaped configuration.

2. The transistors of claim 1, wherein said resistor comprises a polysilicon strip formed between said separate drain contacts.

3. The transistors of claim 1, wherein said semiconductor comprises gallium arsenide.

* * * * *